(12) United States Patent
Liang et al.

(10) Patent No.: US 9,537,058 B2
(45) Date of Patent: Jan. 3, 2017

(54) EMBEDDED WHITE LIGHT LED PACKAGE STRUCTURE BASED ON SOLID-STATE FLUORESCENCE MATERIAL AND MANUFACTURING METHOD THEREOF

(71) Applicant: SHANGHAI FUDI LIGHTING ELECTRONIC CO., LTD., Shanghai (CN)

(72) Inventors: Yueshan Liang, Jiangsu (CN); Dunhua Cao, Jiangsu (CN); Kejun Ma, Jiangsu (CN)

(73) Assignee: SHANGHAI FUDI LIGHTING ELECTRONIC CO., LTD., Shanghai (CN)

( * ) Notice: Subject to any disclaimer, the term of this patent is extended or adjusted under 35 U.S.C. 154(b) by 0 days.

(21) Appl. No.: 14/761,954

(22) PCT Filed: Jun. 5, 2014

(86) PCT No.: PCT/CN2014/079253
§ 371 (c)(1),
(2) Date: Jul. 20, 2015

(87) PCT Pub. No.: WO2015/184618
PCT Pub. Date: Dec. 10, 2015

(65) Prior Publication Data
US 2016/0268482 A1    Sep. 15, 2016

(51) Int. Cl.
*H01L 29/02*    (2006.01)
*H01L 33/50*    (2010.01)
(Continued)

(52) U.S. Cl.
CPC ............. *H01L 33/502* (2013.01); *H01L 33/32* (2013.01); *H01L 33/50* (2013.01); *H01L 33/504* (2013.01);
(Continued)

(58) Field of Classification Search
USPC .......................................................... 257/79
See application file for complete search history.

(56) References Cited

U.S. PATENT DOCUMENTS

| 6,300,716 B1* | 10/2001 | Honda | H01J 61/366 |
| | | | 313/113 |
| 2003/0218180 A1* | 11/2003 | Fujiwara | H01L 33/504 |
| | | | 257/100 |

(Continued)

FOREIGN PATENT DOCUMENTS

| CN | 103840063 A | 6/2014 |
| KR | 101173251 B1 | 8/2012 |

OTHER PUBLICATIONS

International Search Report of PCT Patent Application No. PCT/CN2014/079253 issued on Feb. 27, 2015.

*Primary Examiner* — Michael Lebentritt

(57) ABSTRACT

The present invention discloses an embedded white light LED package structure based on a solid-state fluorescence material. In the present invention, the high power blue light chip is directly embedded into and bonded with a groove of the solid-state fluorescence material, and blue light emitted by the chip and yellow and green light obtained by conversion and emitted by the solid-state fluorescence material are blended by using the principle of lenses, to obtain white light. The embedded white light LED package structure based on a solid-state fluorescence material has a simple process, low cost, and high fluorescence efficiency; and blue light does not leak. Heat dissipation can be directly performed by using the solid-state fluorescence material, and heat dissipation performance is desirable. Energy conservation and environmental protection is achieved, and a service life of an LED lighting device is greatly improved.

10 Claims, 2 Drawing Sheets

(51) Int. Cl.
  *H01L 33/32* (2010.01)
  *H01L 33/60* (2010.01)
  *H01L 33/64* (2010.01)

(52) U.S. Cl.
  CPC ............ *H01L 33/508* (2013.01); *H01L 33/60* (2013.01); *H01L 33/641* (2013.01); *H01L 33/644* (2013.01); *H01L 2933/0033* (2013.01); *H01L 2933/0041* (2013.01); *H01L 2933/0058* (2013.01)

(56) References Cited

U.S. PATENT DOCUMENTS

| | | | | |
|---|---|---|---|---|
| 2004/0104391 A1* | 6/2004 | Maeda | ................. | C09K 11/025 257/79 |
| 2006/0171152 A1* | 8/2006 | Suehiro | .................. | H01L 33/56 362/363 |
| 2008/0231169 A1* | 9/2008 | Hata | ........................ | H01B 1/10 313/500 |
| 2009/0315057 A1* | 12/2009 | Konishi | .................. | H01L 24/97 257/98 |
| 2010/0061078 A1* | 3/2010 | Kim | ........................ | H01L 33/50 362/84 |
| 2010/0258813 A1* | 10/2010 | Lee | ........................ | H01L 21/268 257/76 |
| 2011/0039374 A1* | 2/2011 | Lin | ........................ | H05K 1/021 438/118 |
| 2011/0049558 A1* | 3/2011 | Lin | ......................... | H01L 24/18 257/99 |
| 2011/0273079 A1* | 11/2011 | Pickard | ................. | H01L 33/504 313/483 |
| 2012/0068594 A1* | 3/2012 | Ibbetson | ............... | H01L 33/501 313/501 |
| 2012/0294025 A1* | 11/2012 | Kim | ........................ | H01L 33/46 362/516 |
| 2012/0319575 A1* | 12/2012 | Nakamura | ............ | H01L 33/505 313/512 |
| 2014/0254131 A1* | 9/2014 | Osinski | .................... | F21K 9/56 362/84 |

\* cited by examiner

EMBEDDED WHITE LIGHT LED PACKAGE STRUCTURE BASED ON SOLID-STATE FLUORESCENCE MATERIAL AND MANUFACTURING METHOD THEREOF

BACKGROUND

Technical Field

The present invention relates to the field of LED lighting technologies, and in particular, to an embedded white light LED package structure based on a solid-state fluorescence material and a manufacturing method thereof.

Related Art

LED is a solid-state semiconductor device, and can directly convert electrical energy into light energy. Compared with a traditional incandescent lamp and fluorescent lamp, white light LED has advantages such as low power consumption, high lighting efficiency, a long service life, and energy conservation and environmental protection; therefore, white light LED is not only widely used in the daily lighting field, but also enters the display device field. Currently, technologies for acquiring white light LED may be classified into two types, namely: (1) blending three types of LED chips emitting red, green, and blue rays of light; (2) exciting a proper fluorescence material by using a single-color (blue light or ultraviolet light) LED chip. Currently, white light LED mainly obtains white light by combining a blue light LED chip and fluorescent powder that can be effectively excited by blue light and emits yellow light, and then blending the complementary yellow light and blue light by using the principle of lenses. However, traditional fluorescent powder is characterized by low excitation efficiency and optical conversion efficiency, poor uniformity, and the like. In particular, in the high power lighting field, because epoxy resin or silica gel blended with fluorescent powder easily ages at a high temperature, which reduces a transmittance, and finally seriously affects light extraction efficiency of a white light device.

In addition, a package stand needs to be used in an existing LED package structure, and the blue light easily leaks. Moreover, a process is complex, cost is high, and heat dissipation performance is poor.

SUMMARY

To solve the foregoing problems, the present invention provides an embedded white light LED package structure based on a solid-state fluorescence material and a manufacturing method thereof. Technical problems to be solved by the present invention are that an existing LED package structure has a complex process, high cost, and poor heat dissipation performance; and blue light easily leaks. To achieve the foregoing technical objective, a technical solution of the present invention is an embedded white light LED package structure based on a solid-state fluorescence material, including a blue light chip and a Ce:YAG solid-state fluorescence material, wherein a groove matching the blue light chip is disposed on the Ce:YAG solid-state fluorescence material, and the blue light chip is embedded into the groove.

In the foregoing solution, a light reflecting film is disposed on an embedded surface of the blue light chip of the Ce:YAG solid-state fluorescence material.

In the foregoing solution, the embedded white light LED package structure based on a solid-state fluorescence material further includes a heat conducting substrate, wherein the heat conducting substrate is disposed on an embedded surface of the blue light chip of the Ce:YAG solid-state fluorescence material.

In the foregoing solution, if the embedded white light LED package structure is an embedded white light LED package structure with a solid-state fluorescence material having the light reflecting film disposed therein, the heat conducting substrate is disposed behind the light reflecting film.

In the foregoing solution, a red light film is disposed on a light extraction surface of the Ce:YAG solid-state fluorescence material, and the red light film is capable of converting partial blue light into red light having a light emission band being 580 nm to 660 nm.

In the foregoing solution, the Ce:YAG solid-state fluorescence material is any one of Ce:YAG fluorescent single crystal, Ce:YAG fluorescent polycrystal, Ce:YAG fluorescent ceramic, or Ce:YAG fluorescent glass.

In the foregoing solution, a chemical formula of a main constituent of the Ce:YAG solid-state fluorescence material is $(Y_{1-x-m}A_xCe_m)_3(Al_{1-y}B_y)_5O_{12}$, wherein $0 \leq x \leq 1$, $0 \leq y \leq 1$, and $0 \leq m \leq 0.05$; A is one of Lu, Tb, Pr, La, and Gd; and B is one of Ga, Ti, Mn, Cr, and Zr.

In the foregoing solution, the blue light chip is GaN-based blue light chip.

The present invention further discloses a manufacturing method of an embedded white light LED package structure based on a solid-state fluorescence material, including the following steps:

A. manufacturing a Ce:YAG solid-state fluorescence material;

B: cutting and polishing the Ce:YAG solid-state fluorescence material manufactured in step A, to obtain a solid-state fluorescence piece having a needed size;

C: etching grooves on the solid-state fluorescence piece, and the size of the groove matches the corresponding blue light chip; and D. embedding the blue light chip into the groove of the solid-state fluorescence piece, and installing an electrode, to form the entire package structure.

In the foregoing solution, after step D, the method further includes the following steps:

E. adding a light reflecting film to an end surface of the blue light chip of the package structure;

F. fastening an end surface of the light reflecting film of the package structure to a heat conducting substrate; and G. adding a red light film to the surface of the solid-state fluorescence piece.

Advantages and beneficial effects of the present invention are as follows: The present invention provides an embedded white light LED package structure based on a solid-state fluorescence material and a manufacturing method thereof. A high power blue light chip is directly embedded into and bonded with a groove of the solid-state fluorescence material, and blue light emitted by the chip and yellow and green light obtained by conversion and emitted by the solid-state fluorescence material are blended by using the principle of lenses, to obtain white light. The embedded white light LED package structure based on a solid-state fluorescence material has a simple process, low cost, and high fluorescence efficiency; and blue light does not leak. Heat dissipation can be directly performed by using the solid-state fluorescence material, and heat dissipation performance is desirable.

Energy conservation and environmental protection is achieved, and a service life of an LED lighting device is greatly improved.

BRIEF DESCRIPTION OF THE DRAWINGS

To illustrate the technical solutions in the embodiments of the present invention or in the prior art more clearly, the following briefly introduces the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

Figure 1:
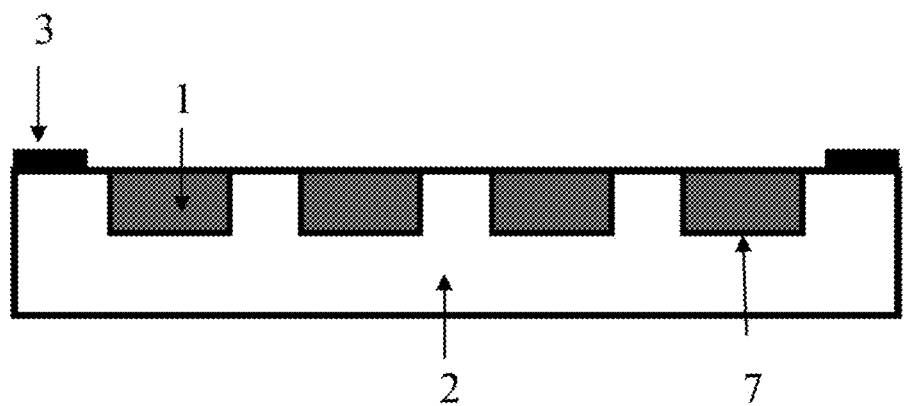
FIG. 1 is a schematic structural diagram of Embodiment 1 of the present invention.

In the figures: 1. Blue light chip, 2. Solid-state fluorescence piece, 3. Electrode, 4. Heat conducting substrate; and 5. Red light film, 6. Light reflecting film, and 7. Groove

DETAILED DESCRIPTION

Specific implementation manners of the present invention are further described with reference to the accompanying drawings and embodiments. The following embodiments are merely intended to describe the technical solutions of the present invention more clearly, and the protection scope of the present invention is not limited thereto.

Embodiment 1

(1) growing Ce:YAG crystals by using a Kyropoulos method;

(2) cutting and polishing the Ce:YAG crystals obtained in step (1), to obtain fluorescence crystal pieces 2 having size being 10*10 millimeters and thickness being 0.5 millimeter;

(3) etching grooves 7 matching the size of blue light chips 1 on the fluorescence crystal piece 2; and (4) placing the blue light chips 1 into the grooves 7 of the fluorescence crystal piece, sequentially connecting blue light chips in series, and finally installing electrodes 3.

An embedded white light LED package structure based on a solid-state fluorescence material that is obtained is shown in FIG. 1.

Embodiment 2

(1) growing Ce:YAG crystals by using a Czochralski method;

(2) cutting and polishing the Ce:YAG crystals obtained in step (1), to obtain fluorescence crystal pieces 2 having size being 6*6 millimeters and thickness being 0.6 millimeter;

(3) etching grooves 7 matching the size of blue light chips 1 on the fluorescence crystal piece 2;

(4) placing the blue light chips 1 into the grooves 7 of the fluorescence crystal piece 2, sequentially connecting blue light chips in series, and installing electrodes 3; and (5) finally fastening the embedded surface of the blue light chip of an entire device obtained in step (4) to a heat conducting substrate 4, to form an entire white light LED package structure.

Figure 2:
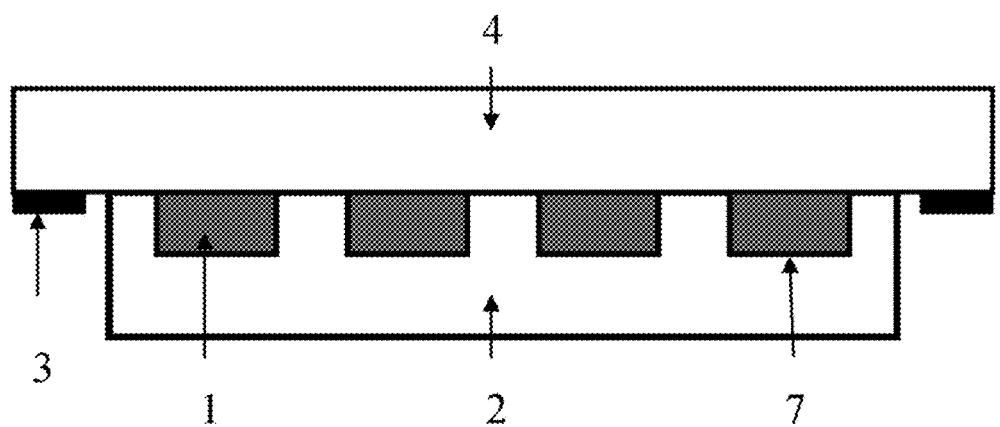
FIG. 2 is a schematic structural diagram of Embodiment 2 of the present invention.

The embedded white light LED package structure based on a solid-state fluorescence material that is obtained is shown in FIG. 2.

Embodiment 3

(1) growing Ce:YAG crystals by using a temperature gradient method;

(2) cutting and polishing the Ce:YAG crystals obtained in step (1), to obtain fluorescence crystal pieces 2 having size being 5*5 millimeters and thickness being 0.6 millimeter;

(3) etching grooves 7 matching the size of the blue light chips 1 on the fluorescence crystal piece 2;

(4) placing the blue light chips 1 into the grooves 7 of the fluorescence crystal piece 2, sequentially connecting blue light chips in series, and installing electrodes 3;

(5) finally fastening an embedded surface of the blue light chip of the fluorescence crystal piece to a heat conducting substrate 4, to form an entire white light LED package structure; and (6) adding a red light film 5 to a light extraction surface of the fluorescence crystal piece 2, to adjust light emission performance of a device.

Figure 3:
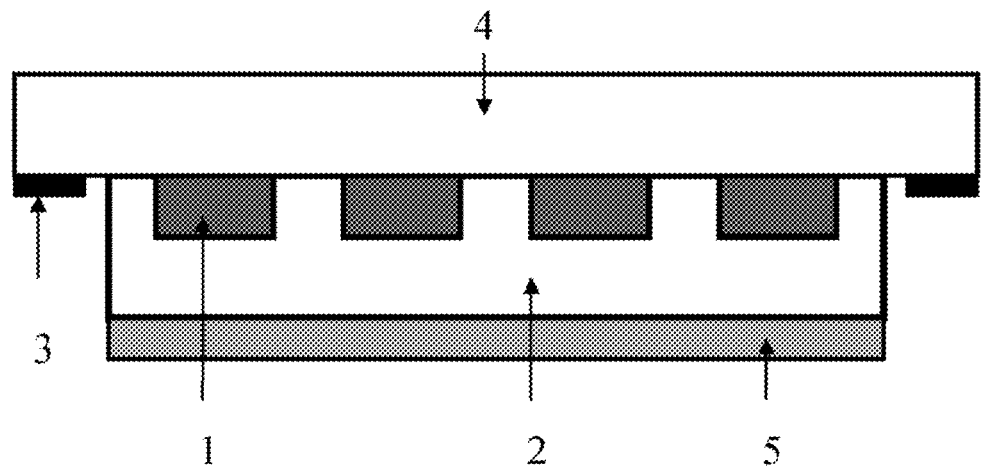
FIG. 3 is a schematic structural diagram of Embodiment 3 of the present invention.

An embedded white light LED package structure based on a solid-state fluorescence material that is obtained is shown in FIG. 3.

Embodiment 4

(1) growing Ce:YAG crystals by using a Czochralski method;

(2) cutting and polishing the Ce:YAG crystals obtained in step (1), to obtain fluorescence crystal pieces 2 having size being 5*5 millimeters and thickness being 0.6 millimeter;

(3) etching grooves 7 matching the size of the blue light chips 1 on the fluorescence crystal piece 2;

(4) placing the blue light chips 1 into the grooves 7 of the fluorescence crystal piece 2, sequentially connecting blue light chips in series, and installing an electrode 3;

(5) adding a light reflecting film 6 to an embedded surface of the blue light chip of the fluorescence crystal piece, to adjust an overall lighting effect of a device; and (6) finally fastening a surface of the light reflecting film of the device to a heat conducting substrate 4, to form an entire white light LED package structure.

Figure 4:
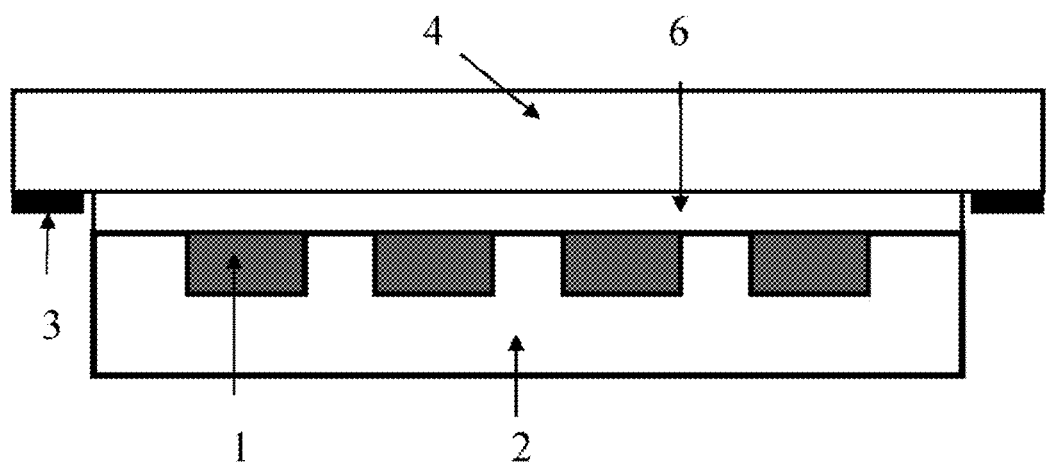
FIG. 4 is a schematic structural diagram of Embodiment 4 of the present invention.

An embedded white light LED package structure based on a solid-state fluorescence material that is obtained is shown in FIG. 4.

The foregoing description shows merely preferred embodiments of the present invention, and are not intended to limit the present invention. Any modification, equivalent replacement, improvement, and the like made within the spirit and principle of the present invention shall fall within the protection scope of the present invention.

What is claimed is:

1. An embedded white light LED package structure based on a solid-state fluorescence material, comprising a blue light chip and a Ce:YAG solid-state fluorescence material, wherein a groove matching the blue light chip is disposed on the Ce:YAG solid-state fluorescence material, and the blue light chip is embedded into the groove wherein the embedded white light LED package structure based on a solid-state fluorescence material further comprises a heat conducting substrate, and the heat conducting substrate is disposed on an embedded surface of the blue light chip of the Ce:YAG solid-state fluorescence material.

2. The embedded white light LED package structure based on a solid-state fluorescence material according to claim 1, wherein a light reflecting film is disposed on an embedded surface of the blue light chip of the Ce:YAG solid-state fluorescence material, the heat conducting substrate is disposed on an embedded surface of the blue light chip of the Ce:YAG solid-state fluorescence material.

3. The embedded white light LED package structure based on a solid-state fluorescence material according to claim 1, wherein a red light film is disposed on a light extraction surface of the Ce:YAG solid-state fluorescence material, and the red light film is capable of converting partial blue light into red light having a light emission band being 580 nm to 660 nm.

4. The embedded white light LED package structure based on a solid-state fluorescence material according to claim 1, wherein the Ce:YAG solid-state fluorescence material is any one of Ce:YAG fluorescent single crystal, Ce:YAG fluorescent polycrystal, Ce:YAG fluorescent ceramic, or Ce:YAG fluorescent glass.

5. The embedded white light LED package structure based on a solid-state fluorescence material according to claim 4, wherein a chemical formula of a main constituent of the Ce:YAG solid-state fluorescence material is $(Y_{1-x-m}A_xCe_m)_3(Al_{1-y}B_y)_5O_{12}$ with $0 \leq x \leq 1$, $0 \leq y \leq 1$, and $0 \leq m \leq 0.05$, A representing one of Lu, Tb, Pr, La, and Gd, and B representing one of Ga, Ti, Mn, Cr, and Zr.

6. The embedded white light LED package structure based on a solid-state fluorescence material according to claim 1, wherein the blue light chip is GaN-based blue light chip.

7. The embedded white light LED package structure based on a solid-state fluorescence material according to claim 2, wherein a red light film is disposed on a light extraction surface of the Ce:YAG solid-state fluorescence material, and the red light film is capable of converting partial blue light into red light having a light emission band being 580 nm to 660 nm.

8. The embedded white light LED package structure based on a solid-state fluorescence material according to claim 2, wherein the Ce:YAG solid-state fluorescence material is any one of Ce:YAG fluorescent single crystal, Ce:YAG fluorescent polycrystal, Ce:YAG fluorescent ceramic, or Ce:YAG fluorescent glass.

9. The embedded white light LED package structure based on a solid-state fluorescence material according to claim 8, wherein a chemical formula of a main constituent of the Ce:YAG solid-state fluorescence material is $(Y_{1-x-m}A_xCe_m)_3(Al_{1-y}B_y)_5O_{12}$ with $0 \leq x \leq 1$, $0 \leq y \leq 1$, and $0 \leq m \leq 0.05$, A representing one of Lu, Tb, Pr, La, and Gd, and B representing one of Ga, Ti, Mn, Cr, and Zr.

10. The embedded white light LED package structure based on a solid-state fluorescence material according to claim 2, wherein the blue light chip is GaN-based blue light chip.

* * * * *